United States Patent
Leong et al.

(10) Patent No.: US 6,288,415 B1
(45) Date of Patent: Sep. 11, 2001

(54) OPTOELECTRONIC SEMICONDUCTOR DEVICES

(75) Inventors: Daniel Leong, Kingston upon Thames (GB); Milton Anthony Harry, North York (CA); Kevin Homewood; Karen Joy Reeson Kirkby, both of Guildford (GB)

(73) Assignee: University of Surrey, Guildford (GB)

( * ) Notice: Subject to any disclaimer, the term of this patent is extended or adjusted under 35 U.S.C. 154(b) by 0 days.

(21) Appl. No.: 09/297,115

(22) PCT Filed: Oct. 22, 1997

(86) PCT No.: PCT/GB97/02919

§ 371 Date: Sep. 24, 1999

§ 102(e) Date: Sep. 24, 1999

(87) PCT Pub. No.: WO98/18167

PCT Pub. Date: Apr. 30, 1998

(30) Foreign Application Priority Data

Oct. 24, 1996 (GB) .................................................. 9622145

(51) Int. Cl.[7] .................................................. H01L 33/00
(52) U.S. Cl. .............................. 257/94; 257/96; 257/103; 257/184; 438/47; 438/94
(58) Field of Search ................................ 257/94, 96, 103, 257/84, 85, 183, 184, 185, 86, 87; 438/46, 47, 93, 94

(56) References Cited

U.S. PATENT DOCUMENTS

| | | | |
|---|---|---|---|
| 4,902,356 | 2/1990 | Noguchi et al. | 148/33.4 |
| 4,914,042 | 4/1990 | Mahan | 437/2 |
| 4,921,817 | 5/1990 | Noguchi | 437/127 |
| 4,946,801 | 8/1990 | Sato et al. | 437/126 |
| 5,401,684 | 3/1995 | Yamada et al. | 437/126 |

FOREIGN PATENT DOCUMENTS

| | | |
|---|---|---|
| 0 317 228 | 5/1989 | (EP) . |
| 2275820 | * 9/1994 | (GB) . |
| WO 93/09564 | * 5/1993 | (WO) . |

OTHER PUBLICATIONS

Hunt et al., "Ion Beam Syntesis of x and βFeSi$_2$ Layers," *Nuclear Instruments and Methods in Physics Research*, B74, pp. 60–64, North—Holland, 1993.*

Oostra et al., "β—FeSi$_2$ in (III) Si and in (00l) Si Formed by Ion—Beam Synthesis", *J. Appl. Physics*, 74 (7), Oct. 1, 1993, pp. 4347–4353.*

Yang et al, "Effect of Annealing Temperature on Optical and Structural Properties of Ion—Beam—Synthesized Semiconducting FeSi$_2$ Layers", *J. Appl. Phys.*. 79 (8), pp. 4312–4316, Apr. 15, 1996.*

Leong et al., "A Silicon/Iron–Disilicide Light–Emitting Diode Operating at a Wavelength of 1.5 μm ", *Nature*, vol. 387, pp. 686–688, Jun. 12, 1997.*

Lefki et al., "Infrared and electrical properties of thin films and junctions of β–FeSi$_2$," *Sensors and Actuators A.*, 33, pp. 81–84 (1992).

Regolini et al., "Selective and epitaxial deposition of β–FeSi$_2$ on silicon by rapid thermal processing–chemical vapor deposition using a solid iron source," *Appl. Phys. Lett.*, 60, pp. 956–958 (1992).

* cited by examiner

*Primary Examiner*—William Mintel
(74) *Attorney, Agent, or Firm*—Leydig, Voit & Mayer, Ltd.

(57) ABSTRACT

An optoelectronic semiconductor device in the form of an LED comprises a silicon p-n junction having a photoactive region containing beta-iron disilicide (β-FeSi$_2$). The LED produces electroluminescence at a wavelength of about 1.5 μm. Photodetector devices are also described

46 Claims, 4 Drawing Sheets

OPTOELECTRONIC SEMICONDUCTOR DEVICES

FIELD OF THE INVENTION

This invention relates to optoelectronic semiconductor devices, for example photoemitters and photodetectors.

BACKGROUND OF INVENTION

In an optoelectronic semiconductor device there are "photoactive" regions in which either emission or detection of photons can take place. Emission of photons takes place when an applied electrical current injects holes and electrons across a junction and the electrons and holes can combine in the photoactive region, the resultant energy being released in the form of photons. Detection of photons takes place when photons incident in the photoactive region create electron-hole pairs, causing an electrical current to flow.

Silicon has an indirect band gap and this has hindered the development of acceptable silicon based photoemitters suitable for use in integrated silicon optoelectronic applications. Silicon's band gap is also high, hindering development of photodetectors sensitive to wavelengths of longer than around 1 μm. Optoelectronic devices which are emissive of, or sensitive to, electromagnetic radiation of about 1.5 μm, which is the basis of optical fibre systems, would be particularly significant in communications applications and in optical computing systems that are resistant to severe electromagnetic interference (EMI). The device architecture proposed by this invention permits such silicon-based optoelectronic devices to be made.

Several different approaches have already been investigated, with a view to developing a suitable photoemissive device which is capable of producing radiation at a wavelength of about 1.5 μm from a silicon-based device. In one approach SiGe superlattice-based structures have been developed making use of zone folding to produce a pseudo direct band gap. In another approach, silicon has been doped with erbium which has an internal transition energy equivalent to 1.5 μm. However, neither of these approaches has led to a practical device.

BRIEF SUMMARY OF THE INVENTION

According to one aspect of the present invention there is provided an optoelectronic semiconductor device having an architecture wherein a junction built in an indirect band gap semiconductor substrate has direct band gap semiconductor material incorporated to form a distinct photoactive region.

The introduction of the direct band gap material to form a distinct photoactive layer related to, but separate from, the junction permits a novel set of semiconductor devices to be created. Semiconductors that do not possess a direct band gap lattice are called "indirect band gap" semiconductors and are generally incapable of efficient electroluminescence.

The inventors have discovered that provision of a direct band gap semiconductor material as hereindefined improves the efficiency with which photons can be absorbed by, or alternatively emitted from the photoactive region.

According to another aspect of the invention there is provided an optoelectronic semiconductor device comprising a junction formed, at least in part, by a layer of an indirect band gap semiconductor material, wherein said layer has a photoactive region containing a direct band gap semiconductor material in which, in operation of the device, electron-hole pairs are either created or combined and which has an energy gap equal to or smaller than the energy gap of the indirect band gap semiconductor material.

Optoelectronic semiconductor devices according to the invention include photoemitters, e.g. a light emitting diode, and photodetectors, e.g. a photodiode.

In the case of a photoemitter, charge carriers are transferred across the junction and are injected into the photoactive region where they may undergo radiative transitions; that is, electrons and holes recombine there, creating photons whose energy is less than or equal to the band gap energy of the direct band gap semiconductor material.

In the case of a photodetector, incident photons having an energy equal to or greater than the band gap energy of the direct band gap semiconductor material create electron-hole pairs in the photoactive region giving rise to a photocurrent.

Preferably, said direct band gap semiconductor material has the form of isolated precipitates or microcrystals. Typically, these are of the order of fifty to several hundred nanometers so that no significant quantum confinement effects will arise.

Alternatively, though less desirably, the direct band gap semiconductor material may form a continuous layer, or a series of continuous layers.

In preferred embodiments of the invention, the direct band gap semiconductor material is beta-iron disilicide (β-FeSi$_2$).

Beta iron-disilicide (β-Fe Si$_2$) a direct band gap semiconductor material having a transition energy corresponding to 1.5 m. Accordingly, embodiments of the invention which incorporate β-FeSi$_2$ in their photoactive regions may find application in optical fibre communications. As already explained, it is preferred that the β-FeSi$_2$ be in the form of isolated precipitates or microcrystals; however, a continuous layer could alternatively be used. Furthermore, the β-FeSi$_2$ may be unalloyed or alloyed, or undoped or doped. β-FeSi$_2$ alloyed with cobalt germanium, indium or aluminium, for example, has a slightly lower transition energy than does the undoped material.

In a preferred photoemitter according to the invention, e.g. a light emitting diode, said junction is a p-n junction formed by a layer of p-type indirect band gap semiconductor material and a layer of n-type indirect band gap semiconductor material.

In this specification, the convention is adopted that the layer of n-type semiconductor material is more heavily doped than is the layer of p-type semiconductor material. In such circumstances, the photoactive region is situated in said layer of p-type semiconductor material so that under forward-biassed conditions electrons will be injected across the junction and captured by the photoactive region. Alternatively, the layer of p-type semiconductor material could be more heavily doped than the layer of n-type semiconductor material. In this case, the photoactive region would be situated in said layer of n-type semiconductor material and holes are injected across the junction from the layer of p-type semiconductor material and captured by the photoactive region.

In the case of a p-n junction emitter, the photoactive region is preferably situated as close as possible to, but wholly outside, the relatively narrow depletion layer prevailing when a forward bias voltage is being applied across the junction. This configuration is preferred so as to maximise the efficiency with which charge carriers are captured by the photoactive region where they can undergo radiative transitions. Alternatively, the photoactive region could be spaced apart from the depletion layer; however, capture of carriers by the photoactive region would then be less efficient.

The p-n junction may be a silicon p-n junction; however it is envisaged that a different homojunction or a heterojunction formed from indirect band gap semiconductor materials could alternatively be used.

In another photoemitter according to the invention, said junction is formed by a layer of indirect band gap semiconductor material and a metallic layer defining a Schottky barrier, and said photoactive region is situated in said layer of indirect band gap semiconductor material. Under forward biassed conditions carriers are transferred across the junction and are captured by the photoactive region where they may undergo radiative transitions.

The photoactive region is preferably situated outside the depletion layer to maximise the capture efficiency. In this embodiment, the indirect band gap semiconductor material is either n-type material or p-type material, and is preferably, though not necessarily, silicon.

Photodetectors according to the invention include photodiodes, such as avalanche photodiodes and depletion-layer photodiodes.

In the case of an avalanche photodiode, said junction is a p-n junction formed by a layer of p-type indirect band gap semiconductor material and a layer of n-type indirect band gap semiconductor material, and said photoactive region is situated in one or the other of said n-and p-type layers, outside the depletion layer. Under reverse-biassed conditions, above the breakdown voltage, electrons and holes created by photons incident in the photoactive region undergo multiplication due to the avalanche process.

The p-n junction may be a silicon p-n junction; however, a different homojunction or a heterojunction formed from indirect band gap semiconductor materials could alternatively be used.

In the case of depletion-layer photodiodes, the photoactive region is situated in the depletion layer. Photons incident in the photoactive region are more likely to be absorbed, and thus give rise to a greater photocurrent than in prior art.

An example of a depletion-layer photodiode according to the invention is a p-i-n photodiode. In a p-i-n photodiode said junction is formed by a layer of intrinsic indirect band gap semiconductor material sandwiched between a layer of p-type indirect band gap semiconductor material and a layer of n-type indirect band gap semiconductor material, and said photoactive region is situated in said layer of intrinsic indirect band gap semiconductor material. Under suitable reverse-biassed conditions, below the breakdown voltage, the photoactive region will be within the depletion layer in the layer of intrinsic indirect band gap semiconductor material and electron-hole pairs created by photons incident in the photoactive region give rise to a photocurrent.

The p-i-n junction may be a silicon p-i-n junction; however, alternatively a different homojunction or a heterojunction formed from indirect band gap semiconductor materials could be used.

Another embodiment of a depletion-layer photodiode according to the invention is a Schottky photodiode. In this embodiment, said junction is formed by a layer of indirect band gap semiconductor material and a metallic layer defining a Schottky barrier, and said photoactive layer is situated in said layer of indirect band gap semiconductor material, inside the depletion layer. Electron-hole pairs created by photons incident in the photoactive region give rise to a photocurrent. The indirect band gap semiconductor material may be either n-type material or p-type material, and is preferably, though not necessarily, silicon.

A yet further embodiment of a depletion layer photodiode according to the invention is a solar cell. In this embodiment, said junction is a p-n junction formed by a layer of p-type indirect band gap semiconductor material and a layer of n-type indirect band gap semiconductor material, and said photoactive region is situated within the depletion layer of the junction. Electron-hole pairs created by photons incident in the photoactive region give rise to a photocurrent. The p-n junction of the solar cell may be a silicon p-n junction; however, alternatively, a different homojunction or a hetero junction formed from indirect band gap semiconductor materials could be used.

Another embodiment of a photodetector according to the invention is a bipolar junction transistor—either a n-p-n phototransistor or a p-n-p phototransistor The bipolar junction is formed by layers of p- and n-type indirect band gap semiconductor material forming the transistor emitter, base and collector regions, and said photoactive region is situated in the base region of the junction.

The bipolar junction may be a silicon junction; alternatively, the junction may be a different homojunction or a hetero junction formed from indirect band gap semiconductor materials.

It may be desirable to have one or more barrier layers in the structure of the above-described devices, for example, to control the migration of impurities.

In all of the foregoing embodiments of the invention, the direct band gap semiconductor material is preferably $\beta$-FeSi$_2$ (doped or undoped, alloyed or unalloyed), which is desirably in the form of isolated precipitates or microcrystals, though less desirably a continuous layer or series of layers could be used.

According to a yet further aspect of the invention there is provided a laser incorporating a photoemitter as herein defined.

According to another aspect of the invention there is provided a method for producing an optoelectronic semiconductor device including a junction, the method including the steps of forming a layer of an indirect band gap semiconductor material defining part of said junction, and providing in said layer a photoactive region containing a direct band gap semiconductor material which has an energy gap equal to or smaller than that of the indirect band gap semiconductor material and, in which, in operation of the device, electron-hole pairs are either created or combined.

The method may include preforming the junction by a growth technique such as molecular beam epitaxy, for example, and providing said direct band gap semiconductor material by an ion implantation process, or vice versa. The direct band gap material may form one or more layers in the photoactive region. Alternatively, the device could be produced in its entirety by an ion beam implantation process. Alternatively, the entire device could be produced by means of a different growth technique such as molecular beam epitaxy.

In a particular implementation of the invention, said direct band gap semiconductor material is provided in said layer as isolated precipitates or microcrystals. An example of said direct band gap semiconductor material is $\beta$-FeSi$_2$.

BRIEF DESCRIPTION OF THE DRAWINGS

Semiconductor devices according to the invention are now described, by way of example only, with reference to the accompanying drawings in which.

DETAILED DESCRIPTION OF THE INVENTION

Figure 1:
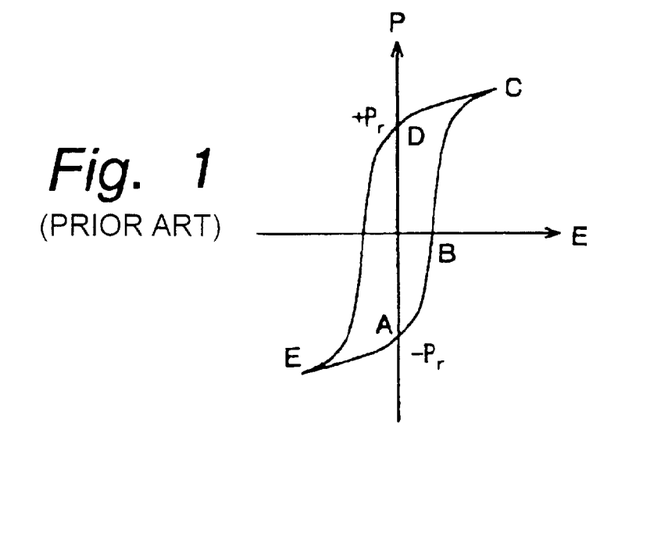
FIG. 1 shows a schematic transverse cross-sectional view through a light emitting diode (LED) according to the invention.

Referring to FIG. 1, the LED comprises a silicon p-n junction 10 formed on a silicon substrate 20. In this example, the silicon substrate 20 is formed from n-type (100) material, and the p-n junction 10 comprises a boron-doped, p-type region 11, 1.0 $\mu$m thick grown by molecular beam epitaxy on an antimony-doped, n-type region 12, 0.4 $\mu$m thick. The p and n-type regions 11,12 have doping densities of $1\times10^{17}$cm$^{-3}$ and $5\times10^{18}$cm$^{-3}$ respectively, and were grown on the silicon substrate 20 with a resistivity in the range 0.008 to 0.02 $\Omega$cm.

The device is also provided with ohmic contacts 15,16 which are formed respectively on the outer surface of the p-type region 11 and on the outer surface of substrate 20, whereby to allow a bias voltage V to be applied across the junction. The contacts 15,16 may conveniently be formed by evaporation and then alloyed onto the respective surfaces; in this particular example, the contacts are 1 mm in diameter, contact 15, on the p-type region, being formed from Al and contact 16, on the substrate, being formed from AuSb eutectic. It will, of course, be appreciated that other suitable contact materials could be used.

Contact 16 on the substrate has a window 17.

The silicon p-n junction 10 has a depletion region 18 (bounded by broken lines in FIG. 1) at the interface of the p and ntype regions 11,12, and an photoactive region 19 (shown hatched) which is provided in the p-type region 11 adjacent to the depletion region 18.

In this embodiment, as will be explained in greater detail hereafter, the photoactive region 19 contains, or consists of, the direct band gap semiconductor material, beta-iron disilicide ($\beta$-FeSi$_2$)

As already explained, $\beta$-FeSi$_2$ has a band gap corresponding to a wavelength of about 1.5 $\mu$m. Under forward-biassed conditions of the p-n junction majority carriers (electrons) in the conduction band of the n-type region 12 of the junction are injected into the junction and captured by the photoactive region 19 where they can undergo radiative transitions to produce photons at a wavelength of about 1.5 $\mu$m. The resultant electroluminescence is transmitted through the transparent layers of silicon in the device and exits the device by the window 17 in contact 16.

The photoactive region 19 is so positioned in the p-type region 11 as to be as close as possible to the depletion layer 18 which prevails when a forward bias voltage is being applied across the junction so as to maximise the capture of majority carriers by the photoactive region.

In this implementation of the invention, the silicon p-n junction 10 was initially grown on substrate 20 by molecular beam epitaxy and the photoactive region 19 was formed subsequently by ion implantation; that is, by the implantation of Fe ions.

If relatively high implantation doses are used, region 19 may be formed as a continuous layer of $\beta$-FeSi$_2$. However, it is thought to be preferable to use a relatively low dose rate (for example, around $1\times10^{16}$cm$^{-2}$) so as to form isolated precipitates of $\beta$-FeSi$_2$, following an annealing step. A suitable annealing schedule is described by Reeson et al in J Mat Res Soc Proc 316, 433 1994.

The formation of isolated precipitates enables a commercially available implanter to be used; also, less processing time is needed and so the costs in production would be much reduced. In this example, an implantation energy of 950 keV was used whereby to form the $\beta$-FeSi$_2$ precipitates immediately adjacent to the depletion region 18, as illustrated in FIG. 1.

Typical precipitate dimensions were of the order of fifty to several hundred nanometers and so no significant quantum confinement effects are produced.

Instead of forming the p-n junction 10 and the photoactive region 19 in separate stages, they could alternatively be formed in a single stage process by means of ion beam synthesis.

The LED was found to be emissive of electroluminescence at the wavelength 1.54 $\mu$m. As already explained, this wavelength is of commercial significance in that it forms the basis of optical fibre communications systems.

In order to investigate the properties and characteristics of the LED, a number of diodes were initially "isolated" by mesa etching down to the substrate 20, and the current-voltage (I–V) characteristics of the devices were measured to investigate diode integrity. Individual diodes were then separated and mounted in a variable temperature, dynamic, continuous-flow, liquid nitrogen cryostat placed in front of a conventional half-meter spectrometer. A liquid nitrogen cooled germanium p-i-n diode was used to detect the electroluminescence.

Figure 2:
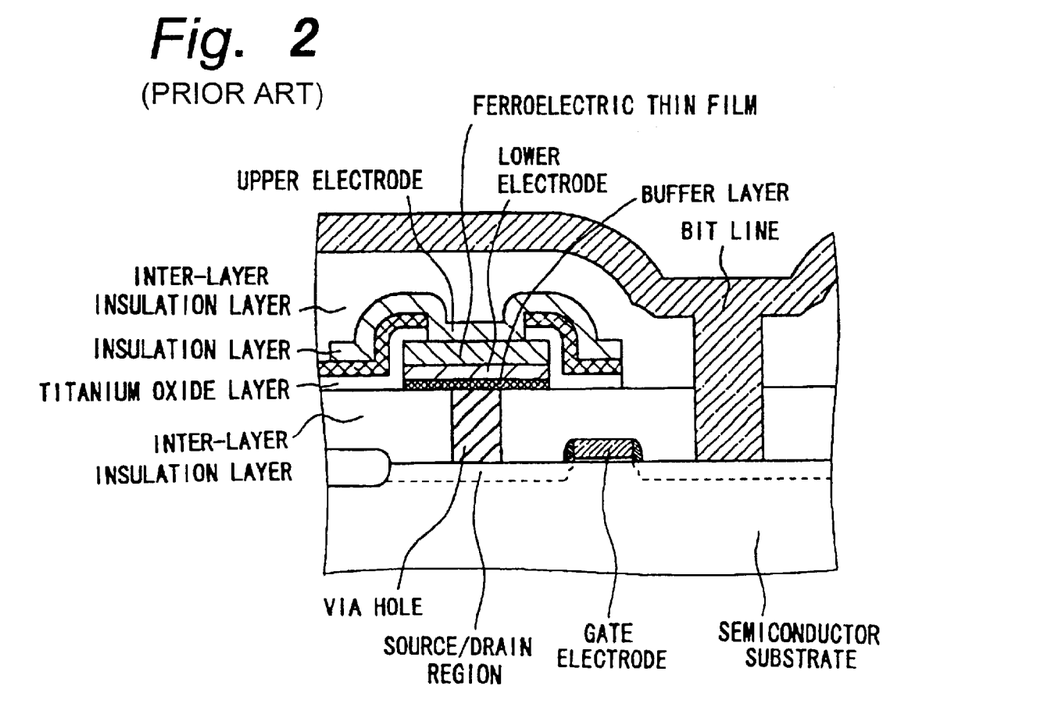
FIG. 2 shows plots of electroluminescence intensity produced by the device of FIG. 1 as a function of applied forward bias voltage at three different temperatures 80K, 180K and 300K.

Initially, measurements were made at 80K. At this temperature, the onset of electroluminescence was observed to occur at a forward-biassed voltage of about 0.8V. The observed electroluminescence intensity as a function of forward-bias voltage is shown in FIG. 2 for three different operating temperatures i.e. 80K, 180K and 300K.

The form of the illustrated curves and the values of the "turn-on" voltages are found to be entirely consistent with conventional injection across a forward bias p-n junction.

Figure 3:
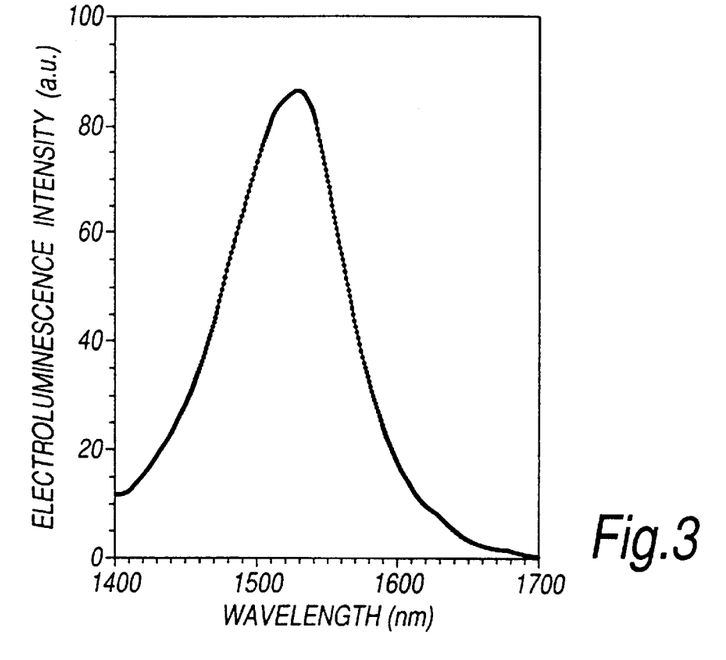
FIG. 3 shows the electroluminescence spectrum produced by the device of FIG. 1 at the temperature 80K.

FIG. 3 shows the electroluminescence spectrum produced by the LED at 80K with a forward bias current of 15 mA. The spectrum is observed to peak at 1.54 $\mu$m and has a full width at half-height of 50 meV.

Figure 4:
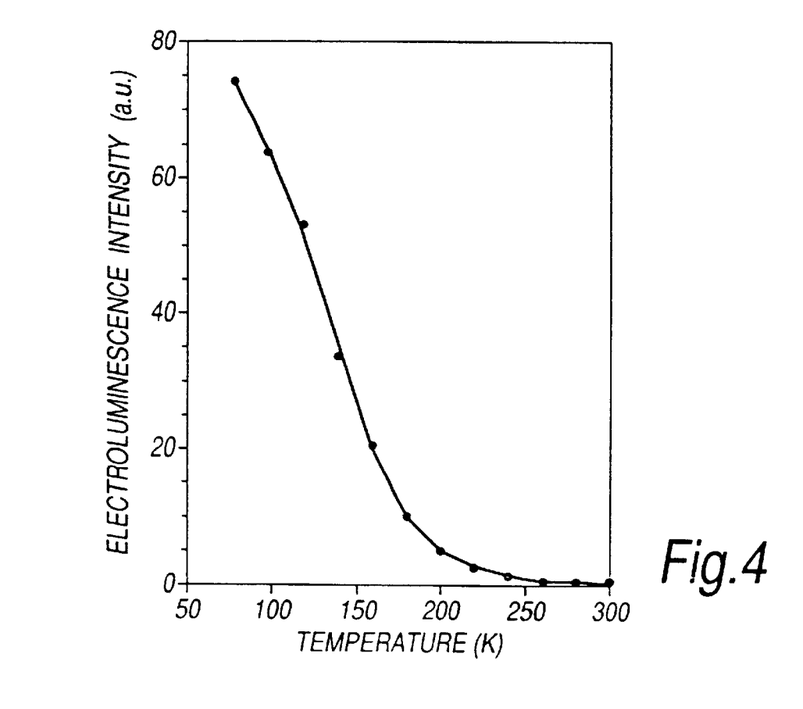
FIG. 4 shows the variation of electroluminescence intensity of the device of FIG. 1 as a function of temperature.

FIG. 4 demonstrates that the observed electroluminescence intensity decreases as a function of increasing temperature, but nevertheless can still be observed at room temperature (300K). It was noted that the peak in the electroluminescence intensity spectrum shifts slightly towards lower energies as the operating temperature increases, this being a characteristic of band-edge related emission.

The device was temperature cycled between room temperature and 80K and was found to operate satisfactorily, in a continuous wave mode, for several hundred hours—no significant change or deterioration in the electroluminescence quality, intensity or operating conditions were observed.

Figure 5:
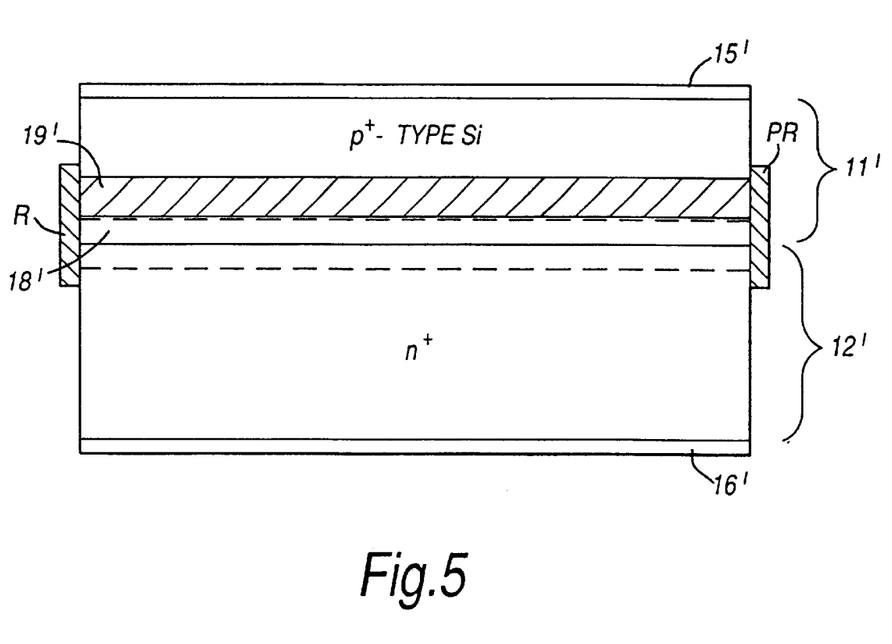
FIG. 5 shows a schematic transverse cross-sectional view through a laser incorporating a photoemitter according to the invention.

It will be understood that although FIG. 1 has been described with reference to a light emitting diode, a p-n structure of this form is also applicable to other forms of photoemissive devices, e.g. an injection laser illustrated schematically in FIG. 5.

The laser has a structure similar to that of the LED described with reference to FIG. 1. However, the doping concentration in n-type 12' layer is somewhat higher, being of the order of $10^{19}$ cm$^3$. An optical cavity is formed by refecting and partially reflecting elements (R and PR respectively) at each end of the device. In alternative embodiments, the p- and n-type layers 11',12', may be interchanged, and the reflecting elements could be positioned above and below the depletion layer 18' and the photoactive region 19' to form a vertical cavity laser.

Figure 6:
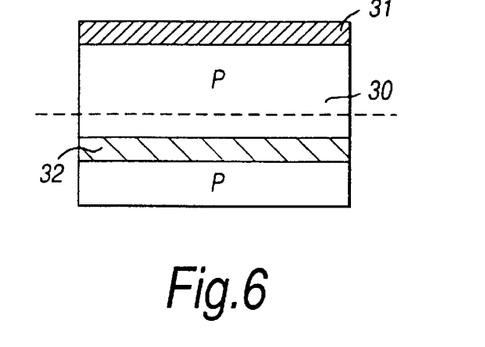
FIG. 6 shows a transverse cross-sectional view through another photoemissive device according to the invention.

FIG. 6 shows a transverse sectional view though a different kind of photoemissive device according to the invention which utilises the Schottky effect. Referring to this Figure, the device comprises a layer 30 of p-type or n-type silicon and a layer 31 of a metal which together form a Schottky barrier. A photoactive region is formed in layer 30 as a layer 32 of the direct band gap semiconductor material, β-FeSi$_2$. Under forward-biassed conditions electrons are injected across the junction formed by layers 30 and 31 and are captured by the photoactive region where they undergo radiative transitions. Layer 30 may be formed from a p-type or n-type indirect band gap semiconductor material different from silicon.

FIGS. 7 to 11 shows transverse sectional views through different photodetector devices according to the invention.

Figure 7:
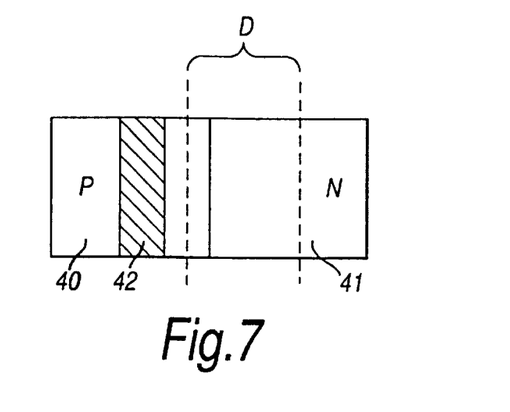
FIGS. 7–11 show transverse cross-sectional views through different photodetector devices according to the invention.

FIG. 7 shows an avalanche photodiode comprising a silicon p-n junction formed by a layer 40 of p-type silicon and a layer 41 of n-type silicon, and having a photoactive region formed by a layer 42 of β-FeSi$_2$ situated in the p-type layer 40, outside the depletion layer D. In an alternative embodiment, the photoactive region is situated in the n-type layer 41, again outside the depletion layer D. In both configurations, the photoactive region enhances absorption of light and carrier generation prior to avalanching in the high field depletion layer.

Figure 8:
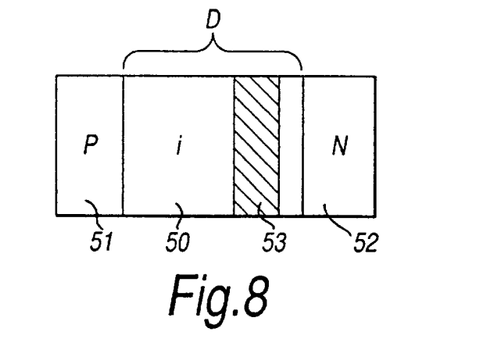

FIG. 8 shows a p-i-n photodiode comprising a layer 50 of intrinsic silicon sandwiched between a layer 51 of p-type silicon and a layer 52 of n-type silicon. In this embodiment, a photoactive region is formed by a layer 53 of β-FeSi$_2$ situated in the layer 50 of intrinsic silicon.

Figure 9:
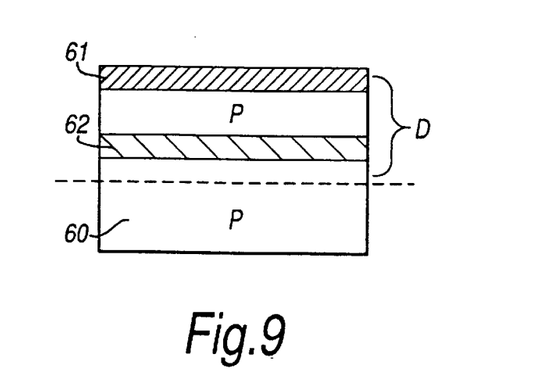

FIG. 9 shows a Schottky photodiode comprising a layer 60 of p-type silicon (although n-type silicon could alternatively be used) and a metallic layer 61 which together form a Schottky barrier. In this embodiment, a photoactive region is formed by a layer 62 of β-FeSi$_2$ situated within the depletion layer D. The photoactive region increases absorption and carrier generation in the depletion layer.

Figure 10:
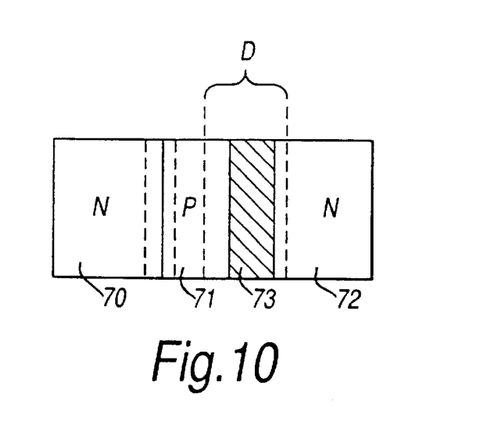

FIG. 10 shows a phototransistor comprising a bipolar junction transistor formed by a layer 70 of n-type silicon (defining the emitter region), a layer 72 of n-type silicon (defining the collector region) and a layer 71 of p-type silicon (defining the base region). In this embodiment, the photoactive region is formed by a layer 73 of β-FeSi$_2$ situated in the base region. The photoactive region increases absorption and carrier generation in the base region.

It will be appreciated that a p-n-p bipolar junction may alternatively be used.

Figure 11:
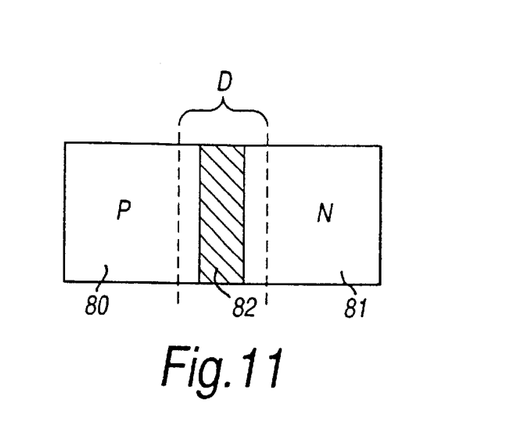

FIG. 11 shows a solar cell comprising a silicon p-n junction formed by a layer 80 of p-type silicon and a layer 81 of ntype silicon. In this embodiment, the photoactive region is formed by a layer 82 of β-FeSi situated in the depletion layer D of the junction. The photoactive region increases absorption and carrier generation in the depletion layer.

It will be appreciated that in all the embodiments described with reference to FIGS. 5 to 11, the direct band gap semiconductor material, β-FeSi$_2$ is preferably in the form of isolated precipitates or microcrystals. However, a continuous layer of β-FeSi$_2$ could alternatively be used. This material may be formed by processes similar to those described hereinbefore in relation to the fabrication of the device of FIG. 1.

Although the preferred direct band gap material is β-FeSi$_2$ (either alloyed or unalloyed, or doped or undoped), it is envisaged that alternative direct band gap materials could be used; however, it is believed that the band gap of these materials should be equal to or less than that of the indirect band gap material in which it is situated.

It will be understood from the foregoing that semiconductor devices according to the present invention will find wide applicability particularly, though not exclusively, as optoelectronic sources and optoelectronic sensors.

What is claimed is:

1. An optoelectronic semiconductor device comprising a junction formed, at least in part, from a layer of indirect band gap semiconductor material, wherein said layer includes a photoactive region in which, in operation of the device, electron-hole pairs are either created or combined, said photoactive region containing a direct band gap semiconductor material, being separate from said junction and defining an energy gap equal to or smaller than the energy gap of the indirect band gap semiconductor material.

2. An optoelectronic semiconductor device as claimed in claim 1 in the form of a photoemitter.

3. An optoelectronic semiconductor device as claimed in claim 2 wherein said photoemitter is a light emitting diode (LED).

4. An optoelectronic semiconductor device as claimed in claim 1 in the form of a photodetector.

5. An optoelectronic semiconductor device as claimed in claim 4 wherein the photodetector is a photodiode.

6. An optoelectronic semiconductor device as claimed in claim 1 wherein said direct band gap semiconductor material has the form of isolated precipitates or microcrystals.

7. An optoelectronic semiconductor device as claimed in claim 6 wherein said isolated precipitates or microcrystals have dimensions of the order of fifty to several hundred nanometres.

8. An optoelectronic semiconductor device as claimed in claim 1 wherein said direct band gap semiconductor material forms a continuous layer or a series of continuous layers.

9. An optoelectronic semiconductor device as claimed in claim 1 wherein said direct band gap semiconductor material is beta-iron disilicide (β-FeSi$_2$).

10. An optoelectronic semiconductor device as claimed in claim 9 wherein said β-FeSi$_2$ is unalloyed or alloyed, or undoped or doped.

11. An optoelectronic semiconductor device as claimed in claim 10 wherein said β-FeSi$_2$ is alloyed with one or more of cobalt, germanium, indium and aluminium.

12. An optoelectronic semiconductor device as claimed in claim 2 wherein said junction is a p-n junction formed by a layer of p-type indirect band gap semiconductor material and a layer of n-type indirect band gap semiconductor material.

13. An optoelectronic semiconductor device as claimed in claim 12 wherein said photoactive region is situated as close as possible to, but wholly outside the depletion layer prevailing when a forward bias is being applied across the junction.

14. An optoelectronic semiconductor device as claimed in claim 12 wherein said p-n junction is a silicon p-n junction.

15. An optoelectronic semiconductor device as claimed in claim 12 wherein said p-n junction is a non-silicon homojunction or a heterojunction formed from indirect band gap semiconductor materials.

16. An optoelectronic semiconductor device as claimed in claim 2 wherein said junction is formed by a layer of indirect band gap semiconductor material and a metallic layer defining a Schottky barrier, and said photoactive region is situated in said layer of indirect band gap semiconductor material.

17. An optoelectronic semiconductor device as claimed in claim 16 wherein said photoactive region is situated outside the depletion layer.

18. An optoelectronic semiconductor device as claimed in claim 16 wherein said indirect band gap semiconductor material is either n-type material or p-type material.

19. An optoelectronic semiconductor device as claimed in claim 18 wherein said indirect band gap semiconductor material is silicon.

20. An optoelectronic semiconductor device as claimed in claim 5 wherein said photodiode is an avalanche photodiode, said junction being a p-n junction formed by a layer of p-type indirect band gap semiconductor material and a layer of n-type indirect band gap semiconductor material, and said photoactive region being situated in one or the other of said n- and p-type layers outside the depletion layer.

21. An optoelectronic semiconductor device as claimed in claim 20 wherein said p-n junction is a silicon p-n junction.

22. An optoelectronic semiconductor device as claimed in claim 20 wherein said junction is a non-silicon homojunction or a heterojunction formed from indirect band gap semiconductor materials.

23. An optoelectronic semiconductor device as claimed in claim 5 wherein said photodiode is a depletion-layer photodiode.

24. An optoelectronic semiconductor device as claimed in claim 23 wherein said depletion-layer photodiode is a p-i-n photodiode.

25. An optoelectronic semiconductor device as claimed in claim 24 wherein said junction is formed by a layer of intrinsic indirect band gap semiconductor material sandwiched between a layer of p-type indirect band gap semiconductor material and a layer of n-type indirect band gap semiconductor material, and said photoactive region is situated in said layer of intrinsic indirect band gap semiconductor material.

26. An optoelectronic semiconductor device as claimed in claim 24 wherein said p-i-n junction is a silicon p-i-n junction.

27. An optoelectronic semiconductor device as claimed in claim 24 wherein said p-i-n junction is a non-silicon homojunction or a heterojunction formed from indirect band gap semiconductor materials.

28. An optoelectronic semiconductor device as claimed in claim 23 wherein said depletion-layer photodiode is a Schottky photodiode.

29. An optoelectronic semiconductor device as claimed in claim 28 wherein said junction is formed by a layer of indirect band gap semiconductor material and a metallic layer defining a Schottky barrier, and said photoactive layer is situated in said layer of indirect band gap semiconductor material, inside the depletion layer.

30. An optoelectronic semiconductor device as claimed in claim 29 wherein said indirect band gap semiconductor material is either n-type material or p-type material.

31. An optoelectronic semiconductor device as claimed in claim 30 wherein said indirect band gap semiconductor material is silicon.

32. An optoelectronic semiconductor device as claimed in claim 23 wherein said depletion-layer photodiode is a solar cell, said junction being a p-n junction formed by a layer of p-type indirect band gap semiconductor material and a layer of n-type indirect band gap semiconductor material, and said photoactive region is situated within the depletion layer of the junction.

33. An optoelectronic semiconductor device as claimed in claim 32 wherein said p-n junction is a silicon p-n junction.

34. An optoelectronic semiconductor device as claimed in claim 32 wherein said p-n junction is a non-silicon homojunction or a heterojunction formed from indirect band gap semiconductor materials.

35. An optoelectronic semiconductor device as claimed in claim 4 wherein said photodetector is a bipolar junction transistor comprising layers of p- and -n type indirect band gap semiconductor material defining the transistor emitter, base and collector regions, said photoactive region being situated in the base region.

36. An optoelectronic semiconductor device as claimed in claim 35 wherein said bipolar junction is a silicon junction.

37. An optoelectronic semiconductor device as claimed in claim 35 wherein said bipolar junction is a non-silicon homojunction or a heterojunction formed from indirect band gap semiconductor materials.

38. An optoelectronic semiconductor device as claimed in claim 12 wherein said direct band gap semiconductor material is $\beta$-FeSi$_2$.

39. An optoelectronic semiconductor device as claimed in claim 38 wherein said $\beta$-FeSi$_2$ is doped or undoped, or alloyed or unalloyed.

40. An optoelectronic semiconductor device as claimed in claim 38 wherein said $\beta$-FeSi$_2$ is in the form of isolated precipitates or microcrystals.

41. An optoelectronic semiconductor device as claimed in claim 38 wherein said $\beta$-FeSi$_2$ is in the form of a continuous layer or series of layers.

42. A laser incorporating a photoemitter as claimed in claim 12.

43. A method for producing an optoelectronic semiconductor device including a junction, the method including the steps of, forming a layer of an indirect band gap semiconductor material defining part of said junction, and providing in said layer a photoactive region, containing a direct band gap semiconductor material which has an energy gap equal to or smaller than that of the indirect band gap semiconductor material, wherein the said photoactive region is separate from said junction and during operation of the device, electron-hole pairs are either created or combined in said photoactive region.

44. A method as claimed in claim 43 including preforming the junction by a growth technique such as molecular beam epitaxy and providing said direct band gap semiconductor material by ion implantation.

45. A method as claimed in claim 43 including producing the device in its entirety by an ion beam implantation process.

46. A method as claimed in claim 43 including producing the device in its entirety by molecular beam epitaxy.

* * * * *

UNITED STATES PATENT AND TRADEMARK OFFICE
CERTIFICATE OF CORRECTION

PATENT NO.    : 6,288,415 B1
DATED         : September 11, 2001
INVENTOR(S)   : Leong et al.

It is certified that error appears in the above-identified patent and that said Letters Patent is hereby corrected as shown below:

Drawings,
Please replace "Sheet 1 of 4, Figures 1 and 2" with the attached Sheet 1 of 4, Figures 1 and 2.

Signed and Sealed this

Second Day of July, 2002

Attest:

Attesting Officer

JAMES E. ROGAN
Director of the United States Patent and Trademark Office

Fig.1

Fig.2